(12) United States Patent
Oh et al.

(10) Patent No.: US 12,090,510 B2
(45) Date of Patent: Sep. 17, 2024

(54) PREPARATION METHOD OF SILICA LAYER

(71) Applicant: LG CHEM, LTD., Seoul (KR)

(72) Inventors: Hyun Taek Oh, Daejeon (KR); Chang Hoon Sin, Daejeon (KR); Kwang Seung Park, Daejeon (KR); Moon Soo Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 1147 days.

(21) Appl. No.: 16/768,315

(22) PCT Filed: Dec. 21, 2018

(86) PCT No.: PCT/KR2018/016447
§ 371 (c)(1),
(2) Date: May 29, 2020

(87) PCT Pub. No.: WO2019/125040
PCT Pub. Date: Jun. 27, 2019

(65) Prior Publication Data
US 2021/0178426 A1 Jun. 17, 2021

(30) Foreign Application Priority Data
Dec. 22, 2017 (KR) .................. 10-2017-0178519

(51) Int. Cl.
| | | |
|---|---|---|
| *B05D 1/38* | (2006.01) | |
| *B05D 3/10* | (2006.01) | |
| *B05D 5/06* | (2006.01) | |
| *B05D 7/24* | (2006.01) | |
| *C09D 5/00* | (2006.01) | |
| *C09D 183/04* | (2006.01) | |
| *G02B 1/113* | (2015.01) | |

(52) U.S. Cl.
CPC .............. *B05D 1/38* (2013.01); *B05D 3/10* (2013.01); *B05D 5/063* (2013.01); *B05D 7/24* (2013.01); *C09D 5/006* (2013.01); *C09D 183/04* (2013.01); *G02B 1/113* (2013.01); *B05D 2320/00* (2013.01); *B05D 2350/63* (2013.01)

(58) Field of Classification Search
CPC .. C09D 183/04; C09D 183/14; C08K 5/3445; C08K 5/34922; C08K 5/29; C08K 5/19; C08K 5/31; B05D 3/107
See application file for complete search history.

(56) References Cited

U.S. PATENT DOCUMENTS

| | | | |
|---|---|---|---|
| 6,365,266 B1 * | 4/2002 | MacDougall | ..... H01L 21/02203 |
| | | | 427/372.2 |
| 7,399,715 B2 | 7/2008 | Tsuchiya et al. | |
| 7,893,538 B2 | 2/2011 | Nakagawa et al. | |
| 7,932,295 B2 | 4/2011 | Tsuchiya et al. | |
| 8,231,966 B2 | 7/2012 | Imai et al. | |
| 8,586,144 B2 | 11/2013 | Suzuki et al. | |
| 9,376,589 B2 * | 6/2016 | Maghsoodi | .......... C09D 173/00 |
| 10,125,267 B2 | 11/2018 | Tamura et al. | |
| 2004/0126573 A1 | 7/2004 | Bier et al. | |
| 2006/0006541 A1 | 1/2006 | Tsuchiya et al. | |
| 2007/0185263 A1 | 8/2007 | Sakamoto et al. | |
| 2008/0079894 A1 | 4/2008 | Matheron et al. | |
| 2009/0142565 A1 | 6/2009 | Takahashi et al. | |
| 2009/0208737 A1 | 8/2009 | Kwon et al. | |
| 2011/0003142 A1 | 1/2011 | Asuka et al. | |
| 2016/0108250 A1 | 4/2016 | Tamura et al. | |

FOREIGN PATENT DOCUMENTS

| | | |
|---|---|---|
| CN | 1335820 A | 2/2002 |
| CN | 1487567 A | 4/2004 |
| CN | 1711485 | 12/2005 |
| CN | 101488491 A | 7/2009 |
| CN | 105263967 A | 1/2016 |
| EP | 1615260 A2 | 1/2006 |
| JP | 2003277042 A * | 10/2003 |
| JP | 2006093657 A | 4/2006 |
| JP | 2008-509800 | 4/2008 |
| JP | 2009237551 | 10/2009 |
| JP | 5120547 | 1/2013 |
| JP | 2015118345 | 6/2015 |
| JP | 2017-058429 | 3/2017 |
| KR | 10-20050086508 | 8/2005 |
| KR | 10-0710097 | 4/2007 |
| KR | 10-20070080566 | 8/2007 |
| KR | 10-20080034996 | 4/2008 |
| KR | 10-20090102658 | 9/2009 |
| KR | 10-2010-0125339 | 11/2010 |
| KR | 10-20150143573 | 12/2015 |
| TW | 200610776 | 4/2006 |
| TW | 200734422 | 9/2007 |
| TW | 200806714 | 2/2008 |
| WO | 9423315 A1 | 10/1994 |

* cited by examiner

*Primary Examiner* — William P Fletcher, III
(74) *Attorney, Agent, or Firm* — Bryan Cave Leighton Paisner LLP

(57) ABSTRACT

Provided is a method for preparing a silica layer, comprising bringing to gelation a precursor layer formed from a precursor composition comprising a silica precursor, an acid catalyst and a surfactant.

15 Claims, No Drawings

PREPARATION METHOD OF SILICA LAYER

CROSS-REFERENCE TO RELATED APPLICATIONS

The present application is a National Stage Application of International Application No. PCT/KR2018/016447 filed on Dec. 21. 2018, which claims priority to Korean Patent Application No. 10-2017-0178519 filed on Dec. 22, 2017, the disclosures of which are incorporated herein by reference in their entirety.

TECHNICAL FIELD

The present application relates to a silica layer.

BACKGROUND

Demand for display products has expanded not only for traditional products such as TVs, monitors or notebooks, but also for mobile products such as smartphones, car navigation systems or instrument panels, and the like.

Among the characteristics to be considered in manufacturing the display product, there is the reflectance of the surface of the product. Usually, an optical film is introduced into the outside of a display product, and this optical film exhibits an average reflectance of about 4%. This reflectance reduces the visibility of the display.

Therefore, technologies such as so-called AG (anti-glare) or AR (anti-reflection) are applied to adjust the reflectance. Among the above technologies, the AG technology affects not only reflected light but also light emitted from a display, which is not suitable from the viewpoint of visibility. On the other hand, the AR technology is difficult to enlarge due to the characteristics formed by the deposition process, etc., and the unit price is high.

DISCLOSURE

Technical Problem

The present application relates to a method for preparing a silica layer. The present application aims to provide a preparation method capable of effectively forming a silica layer having desired physical properties in a simple and efficient manner.

Technical Solution

Throughout this specification, when any member is located on another member, this includes not only when any member is in contact with another member, but also when there is another member between the two members.

Throughout this specification, when any part comprises any component, this means that it does not exclude other components but can further comprise other components, unless specifically stated to the contrary.

Throughout this specification, the description of "A and/or B" means "A or B, or A and B."

In this specification, the unit part by weight can mean a weight ratio between the respective constituents.

Among physical properties mentioned in this specification, when the measured temperature and/or pressure affects the physical property value, the relevant physical property means a physical property measured at room temperature and/or normal pressure, unless otherwise specified.

In the present application, the term room temperature is a natural temperature without warming or cooling, which can mean, for example, any temperature in a range of about 10° C. to about 30° C., or a temperature of 25° C. or 23° C. or so. Also, in the present application, unless otherwise specified, the unit of temperature is Celsius (° C.).

In the present application, the term normal pressure is a natural pressure which is not particularly pressurized or decompressed, which can be, usually, 1 atmosphere or so, like atmospheric pressure.

In the present application, the term alkyl group, alkylene group or alkoxy group can mean a linear or branched alkyl group, alkylene group or alkoxy group, having 1 to 20 carbon atoms, 1 to 16 carbon atoms, 1 to 12 carbon atoms, 1 to 8 carbon atoms or 1 to 4 carbon atoms, or can mean a cyclic alkyl group, alkylene group or alkoxy group, having 3 to 20 carbon atoms, 3 to 16 carbon atoms, 3 to 12 carbon atoms, 3 to 8 carbon atoms or 3 to 6 carbon atoms, unless otherwise specified.

In the present application, the term alkenyl group can mean a linear or branched alkenyl group having 2 to 20 carbon atoms, 2 to 16 carbon atoms, 2 to 12 carbon atoms, 2 to 8 carbon atoms or 2 to 4 carbon atoms, or can mean a cyclic alkenyl group having 3 to 20 carbon atoms, 3 to 16 carbon atoms, 3 to 12 carbon atoms, 3 to 8 carbon atoms or 3 to 6 carbon atoms, unless otherwise specified.

In the present application, the term aryl group or arylene group can mean an aryl group or arylene group, having 6 to 24 carbon atoms, 6 to 18 carbon atoms or 6 to 12 carbon atoms, or can mean a phenyl group or a phenylene group, unless otherwise specified.

In the present application, the term epoxy group can mean a monovalent residue derived from cyclic ether having three ring constituent atoms or a compound comprising the cyclic ether, unless otherwise specified. The epoxy group can be exemplified by a glycidyl group, an epoxyalkyl group, a glycidoxyalkyl group or an alicyclic epoxy group, and the like. Here, the alicyclic epoxy group can mean a monovalent residue derived from a compound containing an aliphatic hydrocarbon ring structure and including a structure in which two carbon atoms forming the aliphatic hydrocarbon ring also form an epoxy group. As the alicyclic epoxy group, an alicyclic epoxy group having 6 to 12 carbons can be exemplified, and for example, a 3,4-epoxycyclohexylethyl group and the like can be exemplified.

The alkyl group, alkylene group, alkoxy group, alkenyl group, aryl group, arylene group or epoxy group can also be optionally substituted with one or more substituents.

The present application relates to a method for preparing a silica layer or to a silica layer. In the present application, the term silica layer means a layer having a silica network as a main component.

The term silica network can mean a network of meshes or three-dimensional cage structures consisting of siloxane linkages (—Si—O—Si—) or comprising the same. In one example, the silica network can be a condensate of alkoxysilane to be described below. The silica network can comprise, for example, units of the following formula A and/or B, or can consist of such units. Here, the fact that the silica network consists of units of the following formula A and/or B means that the silica network contains only units of the following formula A and/or units of the following formula B:

$$R_nSiO_{(4-n)/2} \qquad \text{[Formula A]}$$

$$SiO_{3/2}L_{1/2} \qquad \text{[Formula B]}$$

In Formulas A and B, R is hydrogen, an alkyl group, an alkenyl group, an aryl group, an arylalkyl group, an epoxy group or a (meth)acryloyloxyalkyl group, n is 0 or 1, and L is a divalent linking group of any one selected from the group consisting of a linear, branched or cyclic alkylene group and an arylene group, or a combination of two or more thereof.

In Formula B, as the linear or branched alkylene group, a linear or branched alkylene group having 1 to 20 carbon atoms, 1 to 16 carbon atoms, 1 to 12 carbon atoms, 1 to 8 carbon atoms or 1 to 4 carbon atoms can be exemplified, and as the cyclic alkylene group, a cyclic alkylene group having 3 to 20 carbon atoms, 3 to 16 carbon atoms, 3 to 12 carbon atoms, 3 to 8 carbon atoms or 3 to 6 carbon atoms can be exemplified.

In Formula B, the fact that L is a divalent linking group of any one selected from the group consisting of a linear, branched or cyclic alkylene group and an arylene group, or a combination of two or more thereof means that L is the above-mentioned alkylene group or arylene group, or forms a divalent linking group in combination of two or more selected from them.

In Formula A, the right subscript of the oxygen atom means the number of siloxane linkages formed by one silicon atom in the silica network. For example, when n is 0, Formula A is $SiO_{4/2}$, which means that one silicon atom is connected to four oxygen atoms to form four siloxane linkages. Since the siloxane linkage is formed by sharing one oxygen atom by two silicon atoms, the right subscript 4/2 of the oxygen atom in Formula means that four oxygen atoms are bonded to one silicon atom and each oxygen atom is bonded to another silicon atom. Such a network can be formed, for example, by using a tetrafunctional silane such as tetraalkoxysilane as a raw material in a preparation method to be described below. Similarly, when n is 1, Formula A is $RSiO_{3/2}$, which means a form in which one silicon atom is connected to three oxygen atoms to form three siloxane linkages and R as a functional group is attached to the silicon atom. Such a network can be formed, for example, by using a trifunctional silane such as trialkoxysilane as a raw material in a preparation method to be described below.

Formula B means that one silicon atom is connected to three oxygen atoms, and the three oxygen atoms are each connected to another silicon atom to form three siloxane linkages and simultaneously the silicon atom is connected to another silicon atom via L to form a —Si-L-Si— linkage. Such a network can be formed, for example, by using a compound having a structure in which two trialkoxysilyl groups are connected by a divalent linking group, such as 1,2-bis (triethoxysilane) ethane, as a raw material in a preparation method to be described below.

The silica network of the silica layer of the present application can be composed of any one of the units of Formula A or B, or a combination of two or more of the above units. In this case, as the unit of Formula A, any one of the unit in which n is 0 and the unit in which n is 1 can be used, or both of the two units can be used.

On the other hand, the fact that the silica network is included as a main component in the silica layer can mean a case where the ratio of the silica network in the silica layer is, for example, 55 wt % or more, 60 wt % or more, 65 wt % or more, 70 wt % or more, 75 wt % or more, 80 wt % or more, 85 wt % or more, 90 wt % or more, or 95 wt % or more as a weight ratio. The ratio of the silica network in the silica layer can be 100 wt % or less, or less than 100 wt %.

The preparation method of the present application can be a method for producing a porous silica layer. Thus, in one example, pores can be present inside the silica layer. The shape of the pores present in this silica layer is not particularly limited, but a silica layer in which so-called mesoporous type pores are present can be produced by the present application. This silica layer can be used for various applications. In one example, the silica layer can be applied to form a layer that controls reflectance, for example, a low reflection layer. In the present application, the disadvantages that conventional low reflection layers have not overcome can be overcome and a low reflection layer having improved physical properties can be produced. Therefore, in one example, the preparation method of the present application can be a preparation method of a low reflection layer.

Usually, in order to form a low reflection layer, a coating layer with a low refractive index using a fluorine-based polymer or a layer that hollow silica particles are introduced therein has been applied. However, when the fluorine-based polymer is applied, physical properties such as mechanical strength of the membrane deteriorate, and it is difficult to secure the minimum required surface hardness. Furthermore, in the method using the hollow silica particles, there is a disadvantage that the hollow silica particles are eliminated from the membrane in a use process or a durability evaluation process, and the preparation method thereof is complicated.

However, the silica layer produced in the present application has appropriate refractive index characteristics capable of exhibiting a low reflection effect and simultaneously exhibits appropriate physical strength, and also has no problem of eliminating hollow silica particles.

In particular, according to the present application, such a silica layer can be simply produced without expensive equipment or complicated processes, and high temperature treatment is not required during the process. Therefore, according to the method of the present application, such a silica layer can be directly formed on the surface of a material having poor heat resistance such as a polymer film, if necessary. Therefore, according to the method of the present application, the silica layer can be formed directly on an optical film.

On the other hand, the silica layer can comprise nitrogen or phosphorus atoms together with the silica network. The inventors have confirmed that in forming a silica layer, a porous silica layer having the above-mentioned characteristics can be formed even in a low-temperature process by applying a method known as a so-called sol-gel process, but applying a specific catalyst and if necessary, controlling process conditions. This method is completely different from, for example, the method of applying silazane, which is usually known to form a high-density silica layer, or the method of performing gelation at a high temperature, resulting in a different membrane quality.

For example, the silica layer can comprise nitrogen atoms or phosphorus atoms, which are components derived from the specific catalyst, together with the silica network.

For example, the silica layer formed by the method using silazane, which is one of the methods of forming a silica layer, contains nitrogen atoms derived from silazane, but the relevant nitrogen atoms exist in a form bonded to silicon atoms. That is, the silica layer formed by the method of applying silazane comprises linkages (Si—N) of silicon atoms and nitrogen atoms. However, the nitrogen atoms in the silica layer of the present application do not exist in this state, and thus the silica layer or the silica network of the present application does not contain the linkage (Si—N) of the silicon atom and the nitrogen atom. On the other hand, the silica layer obtained through the high-temperature gelation process does not contain nitrogen atoms or the like as well.

In one example, the nitrogen atoms or phosphorus atoms contained in the silica layer can be nitrogen or phosphorus atoms contained in a specific amine compound, phosphorus compound or imidazole compound, which is a Lewis base, or derived therefrom. That is, the amine compound or the like is used as a catalyst in a silica layer formation process to be described below, and thus nitrogen or phosphorus atoms can be contained in this amine compound or the like or derived therefrom.

Here, the fact that the nitrogen atoms or phosphorus atoms have been derived from an amine compound or the like as a catalyst can mean that when the amine compound or the like is modified into another kind of compound while performing a catalytic action, the relevant nitrogen atom or phosphorus atom is contained in the modified compound.

The amine compound or the like can have a kPa of 8 or less. In another example, the pKa can be 7.5 or less, 7 or less, 6.5 or less, 6 or less, 5.5 or less, 5 or less, 4.5 or less or about 4 or less or so, or can be about 1 or more, 1.5 or more, 2 or more, 2.5 or more, 3 or more or so.

The amine compound or the like can have a boiling point in a range of 80° C. to 500° C. In another example, the boiling point can be 90° C. or higher, 100° C. or higher, 110° C. or higher, 120° C. or higher, 130° C. or higher, 140° C. or higher, 150° C. or higher, 160° C. or higher, 170° C. or higher, 180° C. or higher, 190° C. or higher, 200° C. or higher, 210° C. or higher, 220° C. or higher, 230° C. or higher, 240° C. or higher, 250° C. or higher, 260° C. or higher, 270° C. or higher, 280° C. or higher, 290° C. or higher, 300° C. or higher, 310° C. or higher, 320° C. or higher, 330° C. or higher, 340° C. or higher, or 350° C. or higher, or can be 1,000° C. or lower, 900° C. or lower, 800° C. or lower, 700° C. or lower, 600° C. or lower, 500° C. or lower, 400° C. or lower, or 300° C. or lower or so.

In one example, the catalyst can be an anhydride having a boiling point in the above range. Such a catalyst can effectively perform a gelation process, which is described below, to form a silica network having a dense cross-linked structure. In one example, the catalyst can be a liquid phase anhydride having a boiling point in the above range.

The amine compound or the like can have a flash point of 80° C. or higher. In another examples, the flash point can be 90° C. or higher, 100° C. or higher, 110° C. or higher, 120° C. or higher, 130° C. or higher, 140° C. or higher, 150° C. or higher, or 155° C. or higher, or can be 600° C. or lower, 500° C. or lower, 300° C. or lower, 200° C. or lower, 190° C. or lower, 180° C. or lower, or 170° C. or lower or so.

The amine compound or the like can have a normal temperature vapor pressure of 10,000 Pa or less. In another examples, the normal temperature vapor pressure can be 9,000 Pa or less, 8,000 Pa or less, 7,000 Pa or less, 6,000 Pa or less, 5,000 Pa or less, 4,000 Pa or less, 3,000 Pa or less, 2,000 Pa or less, 1,000 Pa or less, 90 Pa or less, 800 Pa or less, 700 Pa or less, 600 Pa or less, 500 Pa or less, 400 Pa or less, 300 Pa or less, 20 Pa or less, 100 Pa or less, 90 Pa or less, 80 Pa or less, 70 Pa or less, 60 Pa or less, 50 Pa or less, 40 Pa or less, 30 Pa or less, 20 Pa or less, 10 Pa or less, 9 Pa or less, 8 Pa or less, 7 Pa or less, 6 Pa or less, 5 Pa or less, 4 Pa or less, 3 Pa or less, 2 Pa or less, 1 Pa or less, 0.9 Pa or less, 0.8 Pa or less, 0.7 Pa or less, 0.6 Pa or less, 0.5 Pa or less, 0.4 Pa or less, 0.3 Pa or less, 0.2 Pa or less, 0.1 Pa or less, 0.09 Pa or less, 0.08 Pa or less, 0.07 Pa or less, 0.06 Pa or less, 0.05 Pa or less, 0.04 Pa or less, 0.03 Pa or less, 0.02 Pa or less, 0.01 Pa or less, 0.009 Pa or less, 0.008 Pa or less, 0.007 Pa or less, 0.006 Pa or less, 0.005 Pa or less, 0.004 Pa or less, or 0.003 Pa or less, or can be 0.0001 Pa or more, 0.0002 Pa or more, 0.0003 Pa or more, 0.0004 Pa or more, 0.0005 Pa or more, 0.0006 Pa or more, 0.0007 Pa or more, 0.0008 Pa or more, 0.0009 Pa or more, 0.001 Pa or more, 0.0015 Pa or more, or 0.002 Pa or more or so.

By applying an amine compound or the like having the characteristics as described above, a silica layer having desired physical properties can be effectively obtained. The amine compound or phosphorus compound having such physical properties has secondary advantages that it is thermally stable, has a low risk of fire, and has low odor and explosion risk due to low vapor pressure.

The amine compound or the like can be used without particular limitation as long as it has the above-mentioned characteristics.

For example, as the amine compound, a compound of any one of the following Formulas 1 to 4 can be used, and as the phosphorus compound, a compound of any one of the following formulas 5 to 10 can be used:

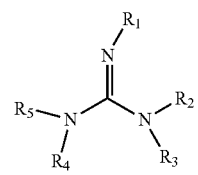

[Formula 1]

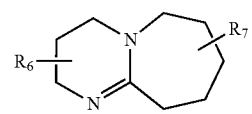

[Formula 2]

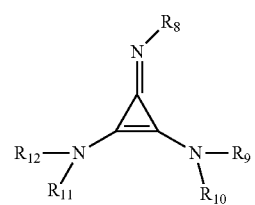

[Formula 3]

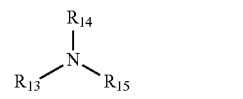

[Formula 4]

In Formulas 1 to 4, $R_1$ to $R_{15}$ can be each independently hydrogen or an alkyl group. On the other hand, in Formula 2, $R_6$ and $R_7$ can be each present as one or two or more, and when present as two or more, each of $R_6$ and $R_7$ can be the same or different.

In Formulas 1 to 4, the alkyl group can be a linear, branched or cyclic alkyl group having 1 to 20 carbon atoms, 1 to 16 carbon atoms, 1 to 15 carbon atoms, 1 to 12 carbon atoms, 1 to 8 carbon atoms or 1 to 4 carbon atoms, or having 4 to 20 carbon atoms, 8 to 20 carbon atoms, 4 to 16 carbon atoms, 6 to 16 carbon atoms, 8 to 16 carbon atoms, 4 to 12 carbon atoms, 6 to 12 carbon atoms or 8 to 10 carbon atoms.

The amine compound can also be, for example, any one compound of the following formulas 1-1, 2-1, 3-1 and 4-1:

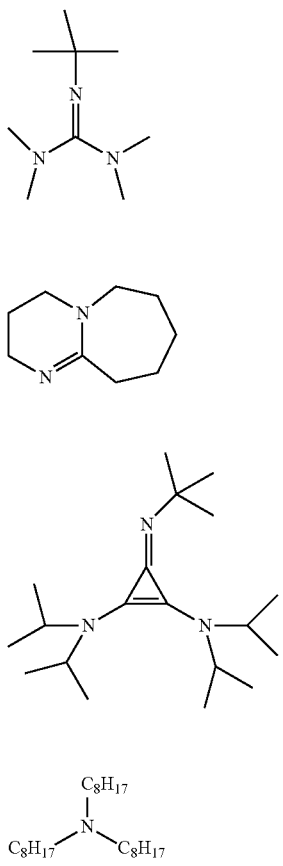

[Formula 1-1]

[Formula 2-1]

[Formula 3-1]

[Formula 4-1]

wherein in Formula 4-1 above, $C_8H_{17}$ is a linear octyl group.

In a suitable example, the amine compound can be a compound wherein in Formula 4, $R_{13}$ to $R_{15}$ are alkyl groups. Here, the alkyl group can be a linear, branched or cyclic alkyl group having 1 to 20 carbon atoms, 1 to 16 carbon atoms, 1 to 15 carbon atoms, 1 to 12 carbon atoms, 1 to 8 carbon atoms or 1 to 4 carbon atoms, or having 4 to 20 carbon atoms, 6 to 20 carbon atoms, 8 to 20 carbon atoms, 4 to 16 carbon atoms, 6 to 16 carbon atoms, 8 to 16 carbon atoms, 4 to 12 carbon atoms, 6 to 12 carbon atoms or 8 to 10 carbon atoms.

On the other hand, as the above-mentioned phosphorus compound or imidazole compound, a compound of any one of the following formulas 5 to 10 can be used.

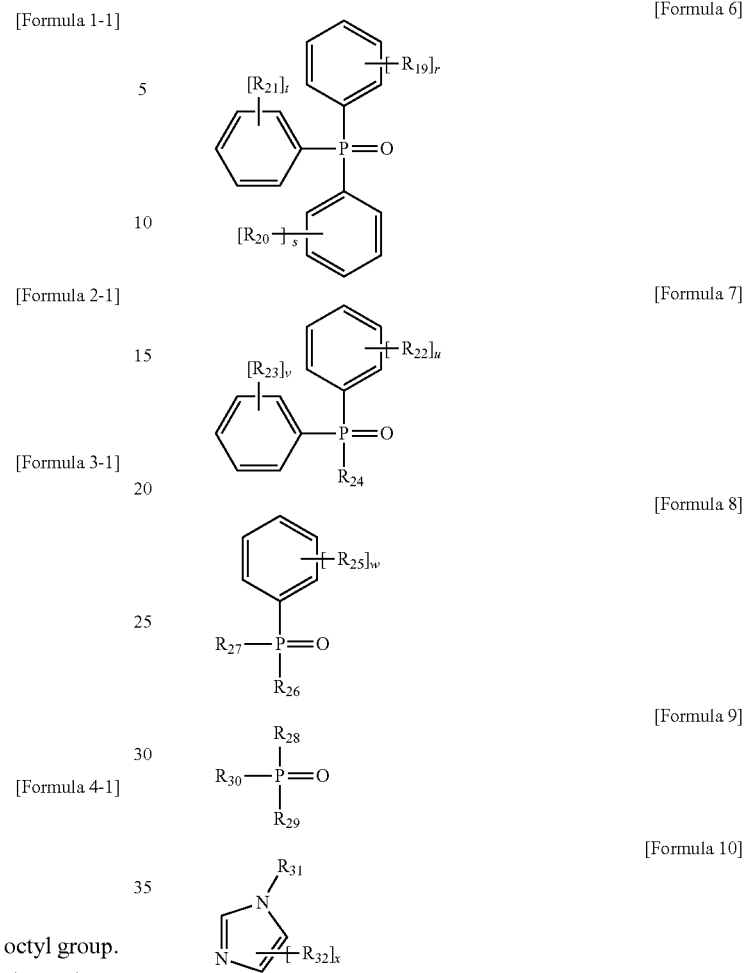

[Formula 5]

[Formula 6]

[Formula 7]

[Formula 8]

[Formula 9]

[Formula 10]

wherein in Formulas 5 to 10, $R_{16}$ to $R_{32}$ can be each independently hydrogen, an alkyl group, or an aryl group; x can be any number from 1 to 3, o to q can be each any number from 1 to 4, and r to w can be each any number of 1 to 5. When o to x are each a plural number, the substituents having the number defined by each can be the same or different from each other.

Accordingly, when o is 2 or more, $R_{16}$ can be the same or different; when p is 2 or more, $R_{17}$ can be the same or different; when q is 2 or more, $R_{18}$ can be the same or different; when r is 2 or more, $R_{19}$ can be the same or different; when s is 2 or more, $R_{20}$ can be the same or different; when t is 2 or more, $R_{21}$ can be the same or different; when u is 2 or more, $R_{22}$ can be the same or different; when v is 2 or more, $R_{23}$ can be the same or different; when w is 2 or more, $R_{25}$ can be the same or different; and when x is 2 or more, $R_{32}$ can be the same or different.

The alkyl group can be substituted or unsubstituted, and can be linear, branched or cyclic, and the number of carbon atoms is not particularly limited, but can be in a range of 1 to 40, 1 to 36, 1 to 32, 1 to 28, 1 to 24, 1 to 20, 1 to 16, 1 to 12, 1 to 8 or 1 to 4.

In this specification, the substitution means that a hydrogen atom bonded to a carbon atom of a compound is replaced with another substituent, where the position to be substituted, that is, the position where the hydrogen atom is substituted is not limited as long as it is a position where a substituent is replaceable, and when two or more are substituted, two or more substituents can be the same or different from each other.

In this specification, the term substituted or unsubstituted means that it has been substituted with one or two or more substituents selected from the group consisting of: deuterium; a halogen group; a nitrile group; a nitro group; a hydroxyl group; a carbonyl group; an ester group; an imide group; an amino group; an alkyl group; a cycloalkyl group; an alkoxy group; an aryloxy group; an alkylthioxy group; an arylthioxy group; an alkylsulfoxy group; an alkenyl group; a silyl group; a boron group; a phosphine oxide group; an amine group; an arylamine group; an aryl group; and a heteroaryl group containing one or more of N, O, S, Se and Si atoms, or is substituted with a substituent that two or more of the substituents exemplified above are linked, or it does not have any substituent.

The aryl group can be substituted or unsubstituted, and when the aryl group is a monocyclic aryl group, the number of carbon atoms is not particularly limited, but can be 6 to 50, 6 to 44, 6 to 38, 6 to 32, 6 to 26, 6 to 20, 6 to 14 or 6 to 12. In the case of a polycyclic aryl group, the number of carbon atoms is not particularly limited as well, which can be, for example, 12 to 50, 12 to 44, 12 to 38, 12 to 32, 12 to 26, 12 to 20 or 12 to 14 or so.

In one example, as the phosphorus compound or imidazole compound, those of the following formulas can be used;

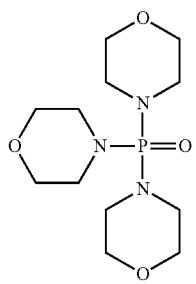

[Formula 5-1]

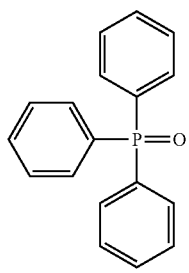

[Formula 6-1]

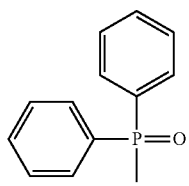

[Formula 7-1]

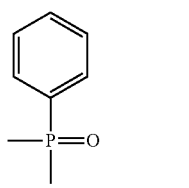

[Formula 8-1]

[Formula 9-1]

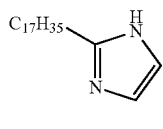

[Formula 10-1]

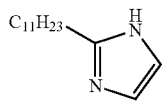

[Formula 10-2]

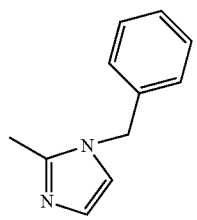

[Formula 10-3]

In another example, the nitrogen atom can be contained in a compound known as a so-called latent base generator, or can be derived therefrom. At this time, the meaning of the derivation is as described above. The term latent base generator means a compound which does not show basicity under a normal environment such as room temperature and normal pressure but exhibits basicity by appropriate heat application or irradiation with light such as ultraviolet rays, or a compound having basicity or a compound which is converted into a catalyst.

For example, the latent base generator can be a compound of the following Formula 11. The compound of the following Formula 11 can act as a thermal base generator:

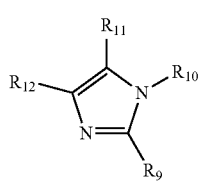

[Formula 11]

wherein in Formula 11, $R_9$ can be hydrogen, an alkyl group having 1 to 20 carbon atoms or an aryl group having 6 to 12 carbon atoms; $R_{11}$ and $R_{12}$ can be each independently hydrogen or an alkyl group having 1 to 4 carbon atoms; and $R_{10}$ can be hydrogen, an alkyl group having 1 to 4 carbon atoms, an arylalkyl group having 7 to 16 carbon atoms or a substituent of the following formula 12:

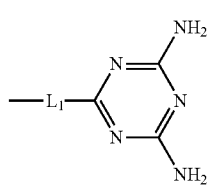

[Formula 12]

wherein in Formula 12, $L_1$ can be an alkylene group having 1 to 4 carbon atoms, which can be, for example, a methylene group or an ethylene group, and the like.

In Formula 11, the alkyl group of $R_9$ can be, in one example, a linear or branched alkyl group having 1 to 20 carbon atoms, 1 to 16 carbon atoms, 1 to 12 carbon atoms, 1 to 8 carbon atoms or 1 to 4 carbon atoms, or can be a linear or branched alkyl group having 1 to 20 carbon atoms, 4 to 20 carbon atoms, 8 to 20 carbon atoms, 12 to 20 carbon atoms or 16 to 20 carbon atoms.

In Formula 11, the aryl group of $R_9$ can be an aryl group having 6 to 12 carbon atoms or a phenyl group.

In Formula 11, the arylalkyl group of $R_{10}$ can be an arylalkyl group which contains an alkyl group with 1 to 4 carbon atoms, while having 7 to 16 carbon atoms, which can be, for example, a phenylalkyl group having an alkyl group with 1 to 4 carbon atoms.

Here, the alkyl group, aryl group, arylalkyl group, and the like can be optionally substituted by one or more substituents, and in this case, the substituent can be exemplified by a hydroxyl group, a nitro group or a cyano group, and the like, but is not limited thereto.

In another example, the base generator can be an ionic compound having a cation of the following Formula 13. The ionic compound having a cation of the following Formula 13 can act as a photo-base generator:

[Formula 13]

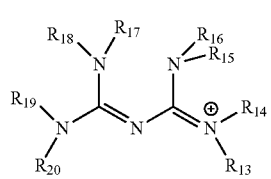

wherein in Formula 13, $R_{13}$ to $R_{20}$ can be each independently hydrogen or an alkyl group having 1 to 20 carbon atoms.

The alkyl group can be a linear or branched alkyl group having 1 to 20 carbon atoms, 1 to 16 carbon atoms, 1 to 12 carbon atoms, 1 to 8 carbon atoms or 1 to 4 carbon atoms, which can be, for example, a methyl group, an ethyl group or a branched propyl group, and the like.

In another example, the alkyl group can be a cyclic alkyl group having 3 to 20 carbon atoms, 3 to 16 carbon atoms, 3 to 12 carbon atoms, 3 to 8 carbon atoms or 4 to 8 carbon atoms, which can be, for example, a cyclohexyl group and the like.

The alkyl group of Formula 13 can be optionally substituted by one or more substituents, and in this case, the substituent can be exemplified by a hydroxyl group, a nitro group or a cyano group, and the like, but is not limited thereto.

In one example, the base generator can be an ionic compound having a cation of the following Formula 14 or 15. The ionic compound having a cation of the following Formula 14 or 15 can act as a photo-base generator:

[Formula 14]

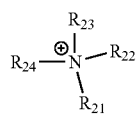

wherein in Formula 14, $R_{21}$ to $R_{24}$ can be each independently hydrogen or an alkyl group having 1 to 20 carbon atoms.

[Formula 15]

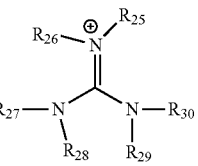

wherein in Formula 15, $R_{25}$ to $R_{30}$ can be each independently hydrogen or an alkyl group having 1 to 20 carbon atoms.

In Formula 14 or 15, the alkyl group can be a linear or branched alkyl group having 1 to 20 carbon atoms, 1 to 16 carbon atoms, 1 to 12 carbon atoms, 1 to 8 carbon atoms or 1 to 4 carbon atoms, which can be, for example, a methyl group, an ethyl group or a branched propyl group, and the like.

In another example, the alkyl group in Formula 14 or 15 can be a cyclic alkyl group having 3 to 20 carbon atoms, 3 to 16 carbon atoms, 3 to 12 carbon atoms, 3 to 8 carbon atoms or 4 to 8 carbon atoms, which can be, for example, a cyclohexyl group and the like.

In Formula 14 or 15, the alkyl group can be optionally substituted by one or more substituents, and in this case, the substituent can be exemplified by a hydroxyl group, a nitro group or a cyano group, and the like, but is not limited thereto.

The kind of an anion included in the ionic compound together with the cation such as Formulas 13 to 15 is not particularly limited, and an appropriate kind of anion can be used.

For example, the anion can be an anion of the following Formula 16 or 17:

[Formula 16]

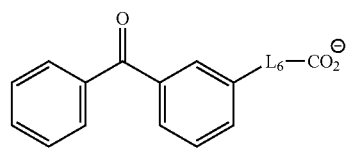

wherein in Formula 16, $L_6$ can be an alkylene group having 1 to 20 carbon atoms, 1 to 16 carbon atoms, 1 to 12 carbon atoms, 1 to 8 carbon atoms or 1 to 4 carbon atoms, or can be an alkylidene group having the same number of carbon atoms.

[Formula 17]

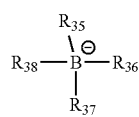

wherein in Formula 17, $R_{35}$ to $R_{38}$ can be each independently hydrogen, an alkyl group or an aryl group.

In Formula 16 or 17, the alkyl group can be a linear, branched or cyclic alkyl group having 1 to 20 carbon atoms, 1 to 16 carbon atoms, 1 to 12 carbon atoms, 1 to 8 carbon atoms or 1 to 4 carbon atoms.

In Formula 16 or 17, the aryl group can bean aryl group having 6 to 30 carbon atoms, 6 to 24 carbon atoms, 6 to 18 carbon atoms or 6 to 12 carbon atoms, or can be a phenyl group.

In one example, the base generator can be a compound of the following Formula 18. The compound of the following Formula 18 can act as a photo-base generator:

[Formula 18]

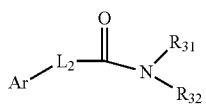

wherein in Formula 18, $R_{31}$ and $R_{32}$ can be each independently hydrogen, a linear, branched or cyclic alkyl group. In another example, $R_{31}$ and $R_{32}$ can be linked to each other to form a nitrogen-containing heterocyclic structure together with the nitrogen atom to which $R_{31}$ and $R_{32}$ are linked.

In Formula 18, Ar can be an aryl group, $L_2$ can be —$L_3$—O— or an alkenylene group having 2 to 4 carbon atoms, wherein $L_3$ can be an alkylene group having 1 to 4 carbon atoms or an alkylidene group having 1 to 4 carbon atoms.

In Formula 18, the alkyl group of $R_{31}$ and $R_{32}$ can be a linear or branched alkyl group having 1 to 20 carbon atoms, 1 to 16 carbon atoms, 1 to 12 carbon atoms, 1 to 8 carbon atoms or 1 to 4 carbon atoms, which can be, for example, a methyl group, an ethyl group or a branched propyl group, and the like.

In another example, the alkyl group of $R_{31}$ and $R_{32}$ in Formula 18 can be a cyclic alkyl group having 3 to 20 carbon atoms, 3 to 16 carbon atoms, 3 to 12 carbon atoms, 3 to 8 carbon atoms or 4 to 8 carbon atoms, which can be, for example, a cyclohexyl group and the like.

In another example, $R_{31}$ and $R_{32}$ can be linked to each other to form a nitrogen-containing heterocyclic structure together with the nitrogen atom to which $R_{31}$ and $R_{32}$ are linked. The ring structure can be a structure which includes one or more, for example, one or two, nitrogen atoms by including the nitrogen atom to which $R_{31}$ and $R_{32}$ are linked and also has 3 to 20, 3 to 16, 3 to 12 or 3 to 8 carbon atoms.

The nitrogen-containing heterocyclic structure can be exemplified by a piperidine structure or an imidazole structure, and the like, but is not limited thereto.

When the nitrogen-containing heterocyclic structure is a piperidine structure, the compound of Formula 18 can have a structure of the following Formula 19; and when it is an imidazole structure, it can have a structure of the following formula 20:

[Formula 19]

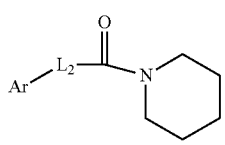

[Formula 20]

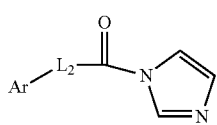

wherein in Formulas 19 and 20, Ar can be an aryl group, which can be, for example, an aryl group having 6 to 30 carbon atoms, 6 to 30 carbon atoms or 6 to 18 carbon atoms.

An example of the aryl group can be exemplified by a phenyl group, a naphthyl group, an anthryl group or an anthraquinonyl group, and the like, and specifically, can be exemplified by a 9-anthryl group, or an anthroquinon-1-yl group or an anthroquinon-2-yl group, and the like, but is not limited thereto.

In Formulas 19 and 20, $L_2$ can be —$L_3$—O— or an alkenylene group having 2 to 4 carbon atoms. Here, in the case of —$L_3$—O—, a structure that is $L_3$ linked to Ar and O linked to the carbon atom of the carbonyl group of Formulas 19 and 20, or a structure that is O linked to Ar and $L_3$ linked to the carbon atom of the carbonyl group of Formula 19 and 20 can be derived.

$L_3$ can be an alkylene group having 1 to 4 carbon atoms or an alkylidene group having 1 to 4 carbon atoms.

The alkyl group, the nitrogen-containing heterocyclic structure, the aryl group, the alkenyl group, the alkylene group and/or the alkylidene group of Formulas 18 to 20 can be optionally substituted by one or more substituents, and the example thereof can be exemplified by a halogen atom, a hydroxyl group, a cyano group, a nitro group, an acryloyl group, a methacryloyl group, an acryloyloxy group and/or a methacryloyloxy group, and the like, but is not limited thereto.

As the latent base generator, a compound having the above-described structure synthesized by a known substance synthesis method or a product known in the art can be obtained and used. Such a product includes WPBG series from WAKO or Curezol products from Shikoku Chemical, but is not limited thereto.

In the present application, the ratio of the nitrogen or phosphorus atoms contained in the silica layer is not particularly limited. That is, as already described, the nitrogen or phosphorus atoms can be derived from the material used as the catalyst in the production process, and in this case, the ratio of nitrogen or phosphorus atoms can be determined according to the amount of the used catalyst.

In one example, the ratio of the nitrogen or phosphorus atoms contained in the silica layer can be in a range of 0.0001 to 6 wt %. The ratio can be about 0.0005 wt % or more or so, 0.001 wt % or more or so, 0.005 wt % or more or so, 0.1 wt % or more or so, 0.15 wt % or more or so, 0.2 wt % or more or so, 0.25 wt % or more or so, 0.3 wt % or more or so, 0.35 wt % or more or so, 0.4 wt % or more or so, 0.45 wt % or more or so, 0.5 wt % or more or so, 0.55 wt % or more or so, or 0.6 wt % or more or so, or can also be 5.8 wt % or less or so, 5 wt % or less or so, 6 wt % or less or so, 5.4 wt % or less or so, 5.2 wt % or less or so, 5 wt % or less or so, 4.8 wt % or less or so, 4.6 wt % or less or so, 4.4 wt % or less or so, 4.2 wt % or less or so, 4 wt % or less or so, 3.8 wt % or less or so, 3.6 wt % or less or so, 3.4 wt % or less or so, 3.2 wt % or less or so, 3 wt % or less or so, 2.8 wt % or less or so, 2.6 wt % or less or so, 2.4 wt % or less or so, 2.2 wt % or less or so, 2.0 wt % or less or so, 1.8 wt % or less or so, 1.6 wt % or less or so, 1.4 wt % or less or so, 1.2 wt % or less or so, 1 wt % or less or so, 0.8 wt % or less or so, 0.6 wt % or less or so, 0.4 wt % or less or so, 0.2 wt % or less or so, 0.1 wt % or less or so, 0.08 wt % or less or so, 0.06 wt % or less or so, 0.04 wt % or less or so, 0.02 wt % or less or so, 0.01 wt % or less or so, 0.008 wt % or less or so, or 0.006 wt % or less or so.

The ratio of nitrogen or phosphorus atoms as mentioned above can be a ratio of nitrogen or phosphorus atoms derived from the above-mentioned catalyst.

Such a ratio of nitrogen or phosphorus atoms can be measured by X-ray photoelectron spectroscopy (XPS). The method is based on a photoelectric effect and performs the analysis by measuring the kinetic energy of electrons emitted by the photoelectric effect due to the interaction of a surface with high energy light. The binding energy can be measured by emitting core electrons of an element of an analytical sample using X-rays as a light source, and measuring kinetic energy of the emitted electrons. The elements constituting the sample can be identified by analyzing the measured binding energy, and information on the chemical bonding state and the like can be obtained through chemical shift. For example, after a silica layer is formed on a silicon wafer to an appropriate thickness (for example, about 0.5 μm to 3 μm), the ratio of nitrogen or phosphorus atoms can be measured in the above manner. In this case, the specific kind of the applied measuring equipment is not particularly limited as long as it is capable of the measurement of the photoelectron spectroscopy.

The silica layer can also further comprise other necessary components optionally in addition to those described above. An example of such a component can be exemplified by (nano) particles such as silica, ceria, titania and/or zirconia, fluorine-based or silicon-based slip agents and/or drying retarders, and the like, but is not limited thereto. These additives can be optionally added in consideration of the purpose, and the specific kinds and ratios thereof can be adjusted depending on the purpose.

Such a silica layer can have an appropriate thickness depending on the intended physical properties. For example, the thickness of the silica layer can be in a range of approximately 50 nm to 200 μm. In another example, the thickness can be 1 μm or more, 2 μm or more, 3 μm or more, 4 μm or more, 5 μm or more, 6 μm or more, 7 μm or more, 8 μm or more, 9 μm or more, or 10 μm or more, or can be 19 μm or less, 18 μm or less, 17 μm or less, 16 μm or less, 15 μm or less, 14 μm or less, 13 μm or less, 12 μm or less, or 11 μm or less.

The thickness of the silica layer of the present application can be controlled depending on the application. For example, when the silica layer is applied as a low reflection layer, the thickness can be determined in a range that the light reflected from the surface of the optical member (for example, an optical film) to which the silica layer is applied and the light reflected from the silica layer can be exhausted by a destructive interference phenomenon or the like. Therefore, such a thickness can be adjusted in consideration of the surface reflectance of the applied optical member and the like.

The silica layer can be produced using a precursor layer formed from a precursor composition comprising a silica precursor and an acid catalyst.

The precursor layer may or may not comprise a latent base generator, i.e., a compound of the above-described chemical structure, as an additional component. When the latent base generator is included, the base can be generated by applying appropriate heat to the silica precursor, or irradiating it with light and gelation can proceed to form a silica layer. When the latent base generator is not included, the preparation method can comprise a step of contacting the precursor layer with a Lewis base. At this time, as the Lewis base, the amine compound or the phosphorus compound (compounds of Formulas 2 to 10) as described above can be used.

In the present application, the term precursor composition is a raw material of a so-called sol-gel method or an intermediate product during processing the sol-gel method, which can mean a composition comprising a silica sol as a condensate of a condensing silane compound. Thus, the silica precursor can be a composition comprising a silica precursor, and the silica precursor can mean a condensing silane compound, which is the applied raw material, and/or a silica sol formed by condensation of the condensing silane compound.

The precursor composition of the present application can be a composition obtained by treating a composition comprising a silane compound as a raw material with an acid catalyst. Thus, the precursor composition can have a pH of at least 5 or less. When the condensation reaction of the raw material is performed using a catalyst so as to have a pH in the above-mentioned range, it is effective to form a silica layer having desired physical properties in a subsequent process. In another example, the pH can be 4.5 or less, 4 or less, or 3.5 or less or so, or can be 0 or more, more than 0, 0.5 or more, or about 1 or more or so.

The silica precursor can comprise a condensing silane compound as a raw material, a hydrolysate of the condensing silane compound and/or a condensation reaction product of the condensing silane compound.

At this time, as the silane compound which is a raw material, for example, a compound of the following formula D or E can be used:

$$\text{SiR}^1_{(4-n)}(\text{OR}^2)_n \qquad \text{[Formula D]}$$

wherein in Formula D, $R^1$ is the same as the definition for R in Formula A, $R^2$ can be an alkyl group having 1 to 4 carbon atoms, an aryl group having 6 to 12 carbon atoms or a hydrogen atom, and the like, and n is 3 or 4.

Here, the alkyl group can be a linear or branched alkyl group having 1 to 4 carbon atoms, and can also be optionally substituted with one or more substituents. The alkyl group can be, for example, a methyl group or an ethyl group.

The alkyl group, alkoxy group or aryl group can be optionally substituted, and in this case, the substituent includes a glycidyl group, a halogen atom, an alicyclic epoxy group, an acryloyl group, a methacryloyl group, an acryloyloxy group or methacryloyloxy group, and the like, but is not limited thereto.

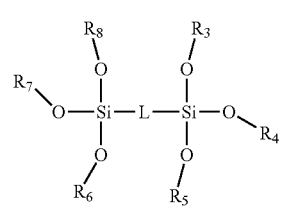

[Formula E]

In Formula E, L is the same as L in Formula B as described above. In one example, L can be an alkylene group having 1 to 4 carbon atoms, or can be a divalent linking group of Formula C above. In Formula E, $R_3$ to $R_8$ are each independently an alkyl group having 1 to 4 carbon atoms, an alkoxy group having 1 to 4 carbon atoms, an aryl group having 6 to 12 carbon atoms or a hydrogen atom. Here, the alkylene group can be a linear or branched alkylene group having 1 to 4 carbon atoms, and can also be optionally substituted with one or more substituents. The alkylene group can be, for example, a methylene group or an ethylene group. Also, in Formula E, the alkyl group can be a linear or branched alkyl group having 1 to 4 carbon atoms, and can also be optionally substituted with one or more substituents. The alkyl group can be, for example, a methyl group or an ethyl group. Here, the alkoxy can be a linear or branched alkoxy group having 1 to 4 carbon atoms, and can also be optionally substituted with one or more substituents. The alkoxy can be, for example, a methoxy group or an ethoxy group. Here, the aryl group can be an aryl group having 6 to 12 carbon atoms or a phenyl group, and the like.

The precursor composition can comprise the aforementioned silica precursor (i.e., the silane compound as the raw material, its hydrolyzate and/or its condensate, and the like), for example, in a range of about 5 to 60 wt %. In another example, the ratio can be about 6% or more, 7% or more, 8% or more, 9% or more, 10% or more, 11% or more, 12% or more, 13% or more, 14 wt % or more, 15 wt % or more, 16 wt % or more, 17 wt % or more, 18 wt % or more, 19 wt % or more, 20 wt % or more, 21 wt % or more, 22 wt % or more, 23% or more, 24 wt % or more, 25 wt % or more, 26 wt % or more, 27 wt % or more, 28 wt % or more, 29 wt % or more, 30 wt % or more, 31 wt % or more, 32 wt % or more, 33 wt % or more, 34 wt % or more, 35 wt % or more, 36 wt % or more, 37 wt % or more, 38 wt % or more, or 39 wt % or more, or can also be about 59 wt % or less, 58 wt % or less, 57 wt % or less, 56 wt % or less, 55 wt % or less, 54 wt % or less, 53 wt % or less, 52 wt % or less, 51 wt % or less, 50 wt % or less, 49 wt % or less, 48 wt % or less, 47 wt % or less, 46 wt % or less, 45 wt % or less, 44 wt % or less, 43 wt % or less, 42 wt % or less, 41 wt % or less, 40 wt % or less, 39 wt % or less, 38 wt % or less, 37 wt % or less, 36 wt % or less, 35 wt % or less, 34 wt % or less, 33 wt % or less, 32 wt % or less, 31 wt % or less, 30 wt % or less, 29 wt % or less, 28 wt % or less, 27 wt % or less, 26 wt % or less, 25 wt % or less, 24 wt % or less, 23 wt % or less, 22 wt % or less, 21 wt % or less, 20 wt % or less, 19 wt % or less, 18 wt % or less, 17 wt % or less, 16 wt % or less, or 15 wt % or less or so.

In one example, the ratio of the silica precursor can be a percentage value obtained by calculating the amount of the solid content to be confirmed after drying and dewatering processes with respect to the precursor composition in relation to the amount of the precursor composition before the drying and dewatering. In one example, the drying process can proceed at about 80° C. for about 1 hour or so, and the dewatering process can proceed at about 200° C. for about 24 hours. In another example, the ratio of the silica precursor can be the amount of the silane compound applied to the preparation of the precursor composition, or can also be a value obtained on the basis of a calculation result of calculating the amount that the applied silane compound reacts at 100% and solates.

Therefore, hereinafter, upon defining the ratio between the components of the precursor composition mentioned in this specification, the ratio or weight of the silica precursor can be based on the ratio or weight of the remaining components after the drying and dewatering processes, or can be based on the amount of the silane compound applied to the preparation of the composition or the amount that the applied silane compound reacts at 100% and solates.

By controlling the ratio of the silica precursor in the precursor composition as above, the viscosity of the precursor composition can be appropriately controlled and the handling property upon coating can be appropriately maintained. In addition, the drying time can be shortened during the process, stains capable of occurring in the silica layer can be prevented, and the thickness of the silica layer can also be maintained uniformly.

The method of maintaining the content of the silica precursor within the above-mentioned range is not particularly limited, and the content can be achieved by controlling the kind of the applied catalyst or the process time in the solation process, and other process conditions.

The precursor composition can be a composition derived using an acid catalyst. For example, the precursor composition can be formed by bringing the silane compound into contact with an appropriate acid catalyst to perform the solation. The kind of the acid catalyst to be applied in the above process and the ratio thereof are not particularly limited and those which can induce a suitable condensation reaction and can secure the pH in the above-mentioned range can be used.

The acid catalyst can be exemplified by one or a mixture of two or more selected from hydrochloric acid, sulfuric acid, fluorosulfuric acid, nitric acid, phosphoric acid, acetic acid, hexafluorophosphoric acid, p-toluenesulfonic acid and trifluoromethanesulfonic acid, and the like, but is not limited thereto.

The amount of the acid catalyst used for forming the precursor composition is not particularly limited, which can be controlled so that the pH in the above-mentioned range and/or the content of the silica precursor can be ensured.

In one example, the acid catalyst can be used such that the precursor composition comprises 0.01 to 50 parts by weight of the acid catalyst relative to 100 parts by weight of the silica precursor. In another example, the ratio can be 0.03 parts by weight or more, 0.1 parts by weight or more, 0.5 parts by weight or more, 1 part by weight or more, 5 parts by weight or more, 10 parts by weight or more, 15 parts by weight or more, 20 parts by weight or more, or 25 parts by weight or more, or can also be 45 parts by weight or less, 40 parts by weight or less, 35 parts by weight or less, 30 parts by weight or less, 25 parts by weight or less, 20 parts by weight or less, 15 parts by weight or less, 10 parts by weight or less, 5 parts by weight or less, or 3 parts by weight or less or so.

The precursor composition can further comprise optional components in addition to the above components. For example, the precursor composition can further comprise a solvent.

In this case, the precursor composition can be prepared by adding the acid catalyst to a mixture comprising the solvent and the silane compound as a raw material.

As the solvent, for example, a solvent having a boiling point in a range of about 50° C. to 150° C. can be used. Such a solvent can be exemplified by an aqueous solvent such as water or an organic solvent, where the organic solvent can be exemplified by an alcohol, ketone or acetate solvent, and the like. An example of the alcohol solvent can be exemplified by ethyl alcohol, n-propyl alcohol, i-propyl alcohol, i-butyl alcohol, n-butyl alcohol and/or t-butyl alcohol, and the like; the ketone solvent can be exemplified by acetone, methyl ethyl ketone, methyl isobutyl ketone, dimethyl ketone, methyl isopropyl ketone and/or acetyl acetone, and the like; and the acetate solvent can be exemplified by methyl acetate, ethyl acetate, propyl acetate and/or butyl acetate, without being limited thereto.

In one example, the composition can comprise a mixed solvent of the aqueous solvent and the organic solvent, where water is used as the aqueous solvent, and the alcohol, ketone and/or acetate solvent as described above can be used as the organic solvent, without being limited thereto.

The amount of the solvent in the precursor composition is not particularly limited, but for example, a solvent having the number of moles about 2 to 8 times the number of moles of the silane compound used as the raw material can be used.

In one example, the precursor composition can comprise a solvent in an amount of 40 to 2,000 parts by weight relative to 100 parts by weight of the silica precursor. In another embodiment, the ratio can be 45 parts by weight or more, 50 parts by weight or more, 55 parts by weight or more, 60 parts by weight or more, 65 parts by weight or more, 70 parts by weight or more, 75 parts by weight or more, 80 parts by weight or more, 85 parts by weight or more, 90 parts by weight or more or so, 95 parts by weight or more or so, 100 parts by weight or more or so, 150 parts by weight or more or so, 200 parts by weight or more or so, 250 parts by weight or more or so, 300 parts by weight or more or so, 350 parts by weight or more or so, 400 parts by weight or more or so, 450 parts by weight or more or so, 500 parts by weight or more or so, 550 parts by weight or more or so, 600 parts by weight or more or so, 650 parts by weight or more or so, 700 parts by weight or more or so, or 750 parts by weight or more or so, or can also be 1,800 parts by weight or less, 1,600 parts by weight or less, 1,400 parts by weight or less, or 1,300 parts by weight or less or so.

When a mixture of an aqueous solvent and an organic solvent is applied as the solvent, the aqueous solvent can be used in an amount of about 5 to 200 parts by weight or so relative to 100 parts by weight of the organic solvent, but is not limited thereto. In another example, the ratio can be about 10 parts by weight or more, 15 parts by weight or more, 20 parts by weight or more, 25 parts by weight or more or 30 parts by weight or more, 35 parts by weight or more or so, 40 parts by weight or more or so, 45 parts by weight or more or so, 50 parts by weight or more or so, 55 parts by weight or more or so, 60 parts by weight or more or so, 65 parts by weight or more or so, 70 parts by weight or more or so, 75 parts by weight or more or so, 80 parts by weight or more or so, 85 parts by weight or more or so, 90 parts by weight or more or so, or 95 parts by weight or more or so, or can also be about 180 parts by weight or less or so, 160 parts by weight or less or so, 140 parts by weight or less or so, 120 parts by weight or less or so, or about 110 parts by weight or less or so.

The precursor composition can also comprise the above-described latent base generator. In this case, the specific type of the latent base generators that can be included is as described above.

When the latent base generator is included, the ratio can be about 0.01 to 50 parts by weight or so relative to 100 parts by weight of the silica precursor. In another example, the ratio of the latent base generator can be approximately 0.05 parts by weight or more, 0.1 parts by weight or more, 0.5 parts by weight or more, 1 part by weight or more, 1.5 parts by weight or more, 2 parts by weight or more, 2.5 parts by weight or more, 3 parts by weight or more, or 3.5 parts by weight or more, or can also be 45 parts by weight or less, 40 parts by weight or less, 35 parts by weight or less, 30 parts by weight or less, 25 parts by weight or less, 20 parts by weight or less, 15 parts by weight or less, 10 parts by weight or less, or 5 parts by weight or less or so.

The precursor composition further comprises a surfactant. Such a surfactant forms so-called micelles in the precursor composition, where these micelles can form the aforementioned pores in the silica layer. Such a surfactant can be added before or after the above-mentioned acid catalyst, or can be added at the same time as the acid catalyst, and the order of addition thereof is not particularly limited.

The micelles can be formed in such a precursor composition, where the micelles can form pores of the silica layer. The surfactant can uniformly and regularly form the micelles in the precursor composition.

As the surfactant, an appropriate kind of general anionic, cationic or nonionic surfactants can be selected and used without particular limitation.

Here, as the anionic surfactant, one or two or more selected from the group consisting of potassium laurate, triethanolamine stearate, ammonium lauryl sulfate, lithium dodecyl sulfate, sodium lauryl sulfate, sodium dodecyl sulfate, alkyl polyoxyethylene sulfate, sodium alginate, dioctyl sodium sulfosuccinate, phosphatidyl glycerol, phosphatidyl inositol, phosphatidylserine, phosphatidic acid and its salts, glyceryl ester, sodium carboxymethylcellulose, bile acid and its salts, cholic acid, deoxycholic acid, glycocholic acid, taurocholic acid, glucodeoxycholic acid, alkyl sulfonate, aryl sulfonate, alkyl phosphate, alkyl phosphonate, stearic acid and its salts, calcium stearate, phosphate, carboxymethyl cellulose sodium, dioctyl sulfosuccinate, dialkyl ester of sodium sulfosuccinate, phospholipids and calcium carboxymethylcellulose can be used.

As the cationic surfactant, one or two or more selected from the group consisting of a quaternary ammonium compound, benzalkonium chloride, cetyltrimethylammonium bromide, chitosan, lauryldimethylbenzylammonium chloride, acylcarnitine hydrochloride, alkylpyridinium halide, cetylpyridinium chloride, a cationic lipid, polymethylmethacrylate trimethylammonium bromide, a sulfonium compound, polyvinylpyrrolidone-2-dimethylaminoethylmethacrylate dimethyl sulfate, hexadecyltrimethylammonium bromide, a phosphonium compound, benzyl-di(2-chloroethyl)ethylammonium bromide, coconut trimethyl ammonium chloride, coconut trimethyl ammonium bromide, coconut methyl dihydroxyethyl ammonium chloride, coconut methyl dihydroxyethyl ammonium bromide, decyl triethyl ammonium chloride, decyl dimethylhydroxyethyl ammonium chloride bromide, C12-15-dimethylhydroxyethylammoniumchloride, C12-15-dimethylhydroxyethylammonium chloride bromide, coconut dimethylhydroxyethylammonium chloride, coconut dimethylhydroxyethylammonium bromide, myristyltrimethylammonium methylsulfate, lauryl dimethyl benzyl ammonium chloride, lauryl dimethyl benzyl ammonium bromide, lauryldimethyl (ethenoxy)4 ammonium chloride, lauryl dimethyl (ethenoxy)4 ammonium bromide, N-alkyl (C12-18)dimethylbenzylammonium chloride, N-alkyl (C12-18)dimethylbenzyl ammonium chloride, N-alkyl (C14-18)dimethyl-benzyl ammonium chloride, N-tetradecyldimethylbenzylammonium chloride monohydrate, dimethyldecylammonium chloride, N-alkyl (C12-14) dimethyl 1-naphthylmethylammonium chloride, trimethylammonium halide alkyl-trimethylammonium salts, dialkyl-dimethylammonium salts, lauryl trimethylammonium chloride, ethoxylated alkylamidoalkyldialkylammonium salts, ethoxylated trialkylammonium salts, dialkylbenzene dialkylammonium chloride, N-didecyldimethylammonium chloride, N-tetradecyldimethylbenzylammonium chloride monohydrate, N-alkyl(C12-14) dimethyl 1-naphthylmethylammonium chloride, dodecyldimethylbenzylammonium chloride, dialkylbenzenealkylammonium chloride, laurylt-rimethylammonium chloride, alkylbenzylmethylammonium chloride, alkylbenzyldimethylammonium bromide, C12 trimethylammonium bromide, C15 trimethyl ammonium bromide, C17 trimethyl ammonium bromide, dodecylbenzyl triethyl ammonium chloride, polydiallyldimethylammonium chloride, dimethyl ammonium chloride, alkyldimethylammonium halogenide, tricetylmethylammonium chloride, decyltrimethylammonium bromide, dodecyltriethylammonium bromide, tetradecyltrimethylammonium bromide, methyltrioctylammonium chloride, POLYQUAT 10, tetrabutylammonium bromide, benzyltrimethylammonium bromide, choline ester, benzalkonium chloride, stearalkonium chloride, cetylpyridinium bromide, cetylpyridinium chloride, halide salts of quaternized polyoxyethylalkylamine, "MIRAPOL" (polyquaternium-2), "Alkaquat" (alkyldimethylbenzylammonium chloride, produced by Rhodia), alkylpyridinium salts, amines, amine salts, imidazolinium salts, protonated quaternary acrylamides, methylated quaternary polymers, and cationic guar gum, benzalkonium chloride, dodecyltrimethylammonium bromide, triethanolamine and poloxamne can be used.

As the nonionic surfactant, one or two or more selected from the group consisting of polyoxyethylene fatty alcohol ether, polyoxyethylene sorbitan fatty acid ester, polyoxyethylene fatty acid ester, polyoxyethylene alkyl ether, polyoxyethylene castor oil derivatives, sorbitan ester, glyceryl esters, glycerol monostearate, polyethylene glycol, polypropylene glycol, polypropylene glycol ester, cetyl alcohol, cetostearyl alcohol, stearyl alcohol, arylalkyl polyether alcohol, polyoxyethylene polyoxypropylene copolymers, poloxamer, poloxamine, methylcellulose, hydroxymethylcellulose, hydroxyethylcellulose, hydroxypropylcellulose, hydroxypropylmethylcellulose, hydroxypropylmethylcellulose phthalate, amorphous cellulose, polysaccharides, starch, starch derivatives, hydroxyethyl starch, polyvinyl alcohol, triethanolamine stearate, amine oxide, dextran, glycerol, acacia gum, cholesterol, tragacanth and polyvinylpyrrolidone can be used.

As the nonionic surfactant, a block copolymer of polypropylene oxide (PPO) and polyethylene oxide (PEO) can also be used.

In one example, as the surfactant, an anionic surfactant and/or a cationic surfactant can be used, and in this case, micelles having smaller diameter can be formed.

In another example, as the surfactant, a nonionic surfactant containing only carbon (C), hydrogen (H) and oxygen (O) can be used. In this case, there is an advantage that the burden on post-treatment and environmental pollution is small because residues due to cations or anions are not generated.

The surfactant can be used in such a ratio that the micelles can be formed at a desired level in the precursor composition, and in one example, about 0.05 moles to 0.25 moles of the surfactant per mole of the silane compound, which is a raw material, or the silica precursor can be used.

In another example, the concentration of the surfactant can be controlled within a range of 1 to 5 times the critical micelle concentration (CMC) for the solvent applied to the precursor composition. An appropriate amount of micelles can be formed in the silica layer or the precursor layer by setting the concentration of the surfactant at least 1 times the critical micelle concentration and the physical properties of the silica layer can be maintained excellent by setting it at most 5 times the critical micelle concentration to minimize or prevent the amount of residual surfactant.

In another example, the surfactant can be in the range of 30 parts by weight to 150 parts by weight relative to 100 parts by weight of the silica precursor, and in another example, it can be in the range of 50 parts by weight to 100 parts by weight. In this range, the desired level of refractive index can be realized and the strength of the silica layer can be stably maintained.

For example, the refractive index (based on a wavelength of 550 nm) of the final silica layer can be controlled to a level within a range of approximately 1.2 to 1.3 through the content of the surfactant as described above, and this refractive index can realize low reflectance through destructive interference of light or the like on an optical base material having a refractive index of approximately 1.55 or so (based on a wavelength of 550 nm).

However, the content range and the refractive index range are one example of the present application, and the relevant content or refractive index can be changed in consideration of the intended use or the like.

The precursor composition can comprise various additives, if necessary, in addition to the above-mentioned components, and examples thereof can include the same components as those exemplified as optional components of the silica layer.

However, in the case where the precursor composition does not contain the latent base generator and accordingly, a contact process with a Lewis base to be described below is performed, the precursor composition can comprise only the above-mentioned acid catalyst as the catalyst and may not comprise other base catalysts. That is, the precursor layer in contact with the Lewis base can comprise only the above-mentioned acid catalyst as the catalyst and may not comprise any base catalyst.

The precursor composition can be prepared, for example, through a process of contacting the silane compound with an acid catalyst and/or a process of adding a surfactant. In one example, the precursor composition can be prepared by mixing the solvent and the silane compound to prepare a silica precursor dispersion liquid and then adding an acid catalyst to the dispersion liquid, followed by adding a surfactant. In addition, if necessary, the above-mentioned latent base generator can be further compounded at an appropriate time.

Here, the types of the applied silane compound, solvent, acid catalyst and surfactant, and the like are the same as described above, and their ratios can also be adjusted according to the above-mentioned ranges. Here, the addition of the acid catalyst and/or the latent base generator can also be performed by adding only the acid catalyst and/or the latent base generator itself to the dispersion liquid or by a method of mixing the acid catalyst and/or the latent base generator with a suitable solvent and then adding the mixture.

The step of forming the precursor composition can be performed so that the composition has a pH of 5 or less, as described above.

The step of forming the precursor composition through contact between the silane compound and the acid catalyst as described above and adding the surfactant can be performed at a temperature of 80° C. or lower. For example, the step can be performed at a temperature of approximately room temperature to 80° C. or lower.

In the present application, the precursor composition as described above is brought to gelation to form a silica layer. When the precursor composition comprises a latent base generator, such a gelation step can be performed by activating the base generator to generate the base, and when the latent base generator is not included, it can also be performed by contacting the precursor composition with an appropriate base. This gelation process can proceed on a base material. In this case, the base material can be a suitable process base material or any one functional layer selected from the group consisting of an organic film, a high-refraction layer, a hard coating layer and an antireflection layer, which are described below; a polarizing film, a protective film of a polarizing film, a luminance enhancement film, a retardation film, a display panel or a touch panel, and the like.

This gelation process can also be performed after molding the precursor composition into an appropriate shape as necessary.

For example, a step of applying the precursor composition onto a suitable base material to form a precursor layer can be performed prior to the gelation process. Here, the application can be performed in a known manner such as bar coating, comma coating, lip coating, spin coating, dip coating and/or gravure coating.

Here, the type of the base material on which the precursor layer is formed is not particularly limited, which can be an appropriate process base material or optical film. In the method of the present application, a desired silica layer can be formed without high-temperature treatment, and thus a silica layer can be directly formed on an optical film usually made of a polymer material having poor heat resistance, or the like. The kind of the optical film as the base material is not particularly limited, which can be, for example, a polarizing film, a protective film of a polarizing film, a luminance enhancement film and/or a retardation film. Furthermore, in another example, the base material can also be a display panel or a touch panel.

In one example, the base material can be an optical film having on one side at least one functional layer of a high-refraction layer, a hard coating layer and an antireflection layer. Specifically, the silica layer can be formed on the functional layer of the base material.

In one example, the base material can be a polymer film, and can be, for example, a base material in which a film, such as a PET (polyethylene terephthalate) film, a PEN (polyethylene naphthalate) film, a PEEK (polyether ether ketone) film and a PI (polyimide) film, exists in the form of a single layer or a multilayer.

In addition, as the polymer film, for example, a TAC (triacetyl cellulose) film; COP (cycloolefin copolymer) films such as norbornene derivatives, an acrylic film such as PMMA (poly(methyl methacrylate), a PC (polycarbonate) film, a PE (polyethylene) film, a PP (polypropylene) film, a PVA (polyvinyl alcohol) film, a DAC (diacetyl cellulose) film, a Pac (polyacrylate) film, a PES (polyether ether sulfone) film, a PEI (polyetherimide) film, a PEN (polyethylene naphthatate) film, a PET (polyethylene terephtalate) film, a PI (polyimide) film, a PSF (polysulfone) film, a PAR (polyarylate) film or a fluororesin film, and the like can also be applied.

If necessary, the base material can also be subjected to suitable surface treatment.

The base material can also be an optically functional film such as a suitable functional film, for example, a retardation film, a polarizing film, a luminance enhancement film, or a high-refraction or low-refraction film, if necessary.

In the above process, the thickness of the coating, that is, the thickness of the precursor layer is determined depending on the thickness of the desired silica layer, which is not particularly limited, and for example, it can be applied in a thickness of approximately 200 nm to 2 μm.

If necessary, in the process of forming the precursor layer, additional treatment such as drying can be performed after application of the precursor composition. For example, a step of drying the applied precursor composition to remove some or all of the solvent can be performed. The drying process can be performed at a temperature of, for example, approximately 120° C. or lower, 100° C. or lower, or 80° C. or lower. In another example, the temperature in the drying step can be approximately 20° C. or higher, 40° C. or higher, 50° C. or higher, or 60° C. or higher. According to one example, the drying step can be performed at a temperature of approximately 120° C. or lower. In another example, the drying step can be performed at approximately 50° C. or higher, 55° C. or higher, 60° C. or higher, 65° C. or higher, 70° C. or higher, or 75° C. or higher, or can also be performed at about 110° C. or lower, 100° C. or lower, 90° C. or lower, or 85° C. or lower or so. In addition, the drying time can be adjusted in a range of approximately 30 seconds to 1 hour, and the time can also be 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 5 minutes or less, 3 minutes or less, or 2 minutes or less or so.

In the process, if necessary, an appropriate pretreatment can also optionally be performed on the precursor layer. For example, the precursor composition and/or the precursor layer can also be subjected to a surface modification process, such as plasma treatment, or the like. At this time, the plasma treatment can be atmospheric plasma treatment, which can be performed by a direct method or an indirect method. This plasma treatment can help improve the strength of the silica layer.

The precursor composition or precursor layer formed through the above process can be subjected to gelation to form a silica layer. Here, the gelation is a process of curing the precursor, and the above-mentioned silica network can be formed by this process. In such a silica network, pores formed by the micelles due to the above-mentioned surfactant can be present.

When the precursor composition or precursor layer does not comprise the latent base generator, the gelation process can be performed through a step of contacting the precursor composition or precursor with an amine compound, which is the above-described Lewis base, or the like. The term Lewis base means a material capable of giving non-covalent electron pairs, as is known. In the present application, the above-mentioned specific precursor composition or precursor layer is brought into contact with a Lewis base and brought to gelation to form a silica layer, whereby the silica layer having desired physical properties can be formed even at a low temperature.

The method of bringing the precursor layer or the like into contact with the Lewis base is not particularly limited. For example, a method of immersing the precursor layer in the Lewis base, or coating, spraying and/or dropping the Lewis base on the precursor layer, and the like can be applied.

As the Lewis base, an amine compound having the pKa, boiling point, flash point and/or normal temperature vapor pressure as described above can be used.

Such an amine compound can be in a liquid phase at a temperature of 120° C. or 120° C. or lower. That is, the amine compound can also be applied as itself or can be mixed with an aqueous solvent, such as water, or an organic solvent, and the like and applied. For example, when the compound is in a solid phase at a temperature of 120° C. or lower, it can be dissolved in an aqueous or organic solvent and used. Here, the usable organic solvent can be exemplified by one or more of N,N-dimethylacetamide (DMAc), N-methylpyrrolidone (NMP), N,N-dimethylformamide (DMF), 1,3-dimethyl-2-imidazolidinone, N,N-diethylacetamide (DEAc), N,N-dimethylmethoxyacetamide, dimethylsulfoxide, pyridine, dimethylsulfone, hexamethylphosphoramide, tetramethylurea, N-methylcaprolactam, tetrahydrofurane, m-dioxane, p-dioxane, 1,2-dimethoxyethane, bis(2-methoxyethyl)ether, 1,2-bis(2-(methoxyethoxy)ethane, bis[2-(2-methoxyethoxy)]ether, poly(ethylene glycol) methacrylate (PEGMA), gamma-butyrolactone (GBL), and equamide (Equamide M100, Idemitsu Kosan), but is not limited thereto.

As described above, the Lewis base is brought into contact with the above-mentioned specific precursor composition to perform gelation, whereby the silica layer having desired physical properties can be effectively obtained.

That is, the gelation or curing reaction of the precursor layer can be induced by the contact with the Lewis base.

Such gelation or curing can proceed even at a low temperature condition and can proceed effectively without any special treatment to form a silica layer having desired physical properties. In one example, the gelation or curing reaction, that is, the contact with the Lewis base, can be performed at a low temperature, for example at about 120° C. or less or so. In one example, the contact can also be performed at 110° C. or lower, 100° C. or lower, 90° C. or lower, or 85° C. or lower and can also be performed at 60° C. or higher, 65° C. or higher, 70° C., or 75° C. or higher or so.

Such gelation or curing can be performed for an appropriate time, and for example, can be performed for approximately 1 minute to 20 minutes or 3 minutes to 10 minutes or so, but is not limited thereto.

When the latent base generator is included, the silica precursor can be applied by heat or irradiated with light, without the contact process, to generate a base, thereby performing the gelation or curing and forming a silica layer.

When the latent base generator has been included, the gelation process can be performed through the step of activating the base generator. The activation step is collectively referred to as a step of converting the relevant generator to a basic compound or a catalyst, or producing the compound or catalyst.

The specific conditions of the activation step of the base generator can be adjusted in consideration of the kind of the used base generator. For example, when the thermal base generator is applied, the activation step can be performed by applying heat so that the silica layer is maintained at a temperature within the range of about 50° C. to 250° C., a temperature within the range of about 50° C. to 200° C. or a temperature within the range of about 50° C. to 150° C., and when the photo-base generator is applied, it can be performed by irradiating the silica layer with light having a wavelength of approximately 300 nm to 450 nm. Here, the heat application can be performed, for example, for a time in a range of approximately 1 minute to 1 hour, and the light irradiation can be performed at an intensity of approximately 200 mJ/cm$^2$ to 3 J/cm$^2$.

In the present application, the silica layer can be formed in the same manner as above. In the present application, after forming the silica layer in this manner, another additional process such as an optional cleaning process can also be performed.

For example, following the gelation step, a process of removing the residual surfactant can also be performed. The method for performing the above step is not particularly limited, and for example, the above step can be performed by a method of washing the silica layer with a suitable aqueous solvent (water, etc.) and/or an organic solvent. In one example, the step of removing the residual surfactant can be performed using ultrasonic cleaning with an aqueous solvent (water, etc.) and/or an organic solvent, where the process temperature can be adjusted by a method of washing it while heating an aqueous solvent (water, etc.) and/or an organic solvent at a temperature within approximately 100° C.

In the case of obtaining a low refractive index, the removal can be performed using an organic solvent, for example, an alcohol, a ketone solvent or an acetate solvent. Accordingly, the desired refractive index can be more effectively achieved. In this case, an example of the alcohol solvent can be exemplified by ethyl alcohol, n-propyl alcohol, i-propyl alcohol, i-butyl alcohol, n-butyl alcohol and/or t-butyl alcohol, and the like; the ketone solvent can be exemplified by acetone, methyl ethyl ketone, methyl isobutyl ketone, dimethyl ketone, methyl isopropyl ketone and/or acetyl acetone, and the like; and the acetate solvent can be exemplified by methyl acetate, ethyl acetate, propyl acetate and/or butyl acetate, and the like, without being limited thereto.

The temperature of the washing process is not particularly limited. For example, the process can be performed at a temperature within the range of approximately 20° C. to 100° C. In another example, the temperature can be about 25° C. or higher, 30° C. or higher, 35° C. or higher, 40° C. or higher, 45° C. or higher, or 55° C. or higher, or can be 90° C. or lower, 80° C. or lower, 70° C. or lower, or 60° C. or lower.

Also, the washing time is not limited, which can be performed, for example, for about 1 to 100 hours. In another example, the time can be about 2 hours or more, 3 hours or more, 4 hours or more, 5 hours or more, 6 hours or more, 7 hours or more, 8 hours or more, 9 hours or more, 10 hours or more, 11 hours or more, 12 hours or more, 13 hours or more, 14 hours or more, 15 hours or more, or 16 hours or more, or can also be 90 hours or less, 80 hours or less, 70 hours or less, 60 hours or less, 50 hours or less, 40 hours or less, 30 hours or less, or 20 hours or less.

In the method of the present application, all processes can proceed to low-temperature processes. That is, all processes of the present application can be performed under a temperature of the low-temperature process to be described below. In the present application, the term low-temperature process means a process having a process temperature of about 350° C. or lower, about 300° C. or lower, about 250° C. or lower, about 200° C. or lower, about 150° C. or lower, or about 120° C. or lower. In the production process of the silica layer of the present application, all the processes can be performed in the above temperature range.

In the present application, since a silica layer having desired physical properties, for example, a high-density and high-hardness silica layer can be effectively formed even by the low-temperature process as described above, for example, a large amount of silica layers having desired physical properties can be formed by a continuous and inexpensive process, and the silica layer can also be effectively formed directly even on a base material which is weak against heat, such as a polymer film. The lower limit of the process temperature in the low-temperature process is not particularly limited, and for example, the low-temperature process can be performed at about 10° C. or higher, 15° C. or higher, 20° C. or higher, or 25° C. or higher.

Such a production process of the silica layer of the present application can be effectively performed even in a continuous process by a so-called roll to roll process or the like.

In addition, the silica layer of the present application has an appropriate refractive index characteristic by the pores contained therein, and thus, it can be effectively used for applications of, for example, a low reflection layer and the like.

The present application also relates to a laminate comprising the silica layer. The laminate can comprise, for example, the silica layer and an organic film in contact with the silica layer. Here, the silica layer can be formed directly on the organic film, and therefore, any kind of layer may not exist between the silica layer and the organic film. At this time, the type of the applied organic film is not particularly limited, which can be, for example, a functional layer known as a high-refraction layer, a hard coating layer or an antireflection layer, and the like, or an optical film in which the functional layer is optionally formed on the surface, a polarizing film, a protective film of a polarizing film, a luminance enhancement film and/or a retardation film, or other polymer films, or a display panel or a touch panel, and the like, but is not limited thereto.

Advantageous Effects

The present application can provide a method capable of easily forming a silica layer, in which pores are formed inside and optical characteristics including a refractive index and the like are appropriately controlled, as a membrane having a silica network as a main component, through a simple process at a low temperature without using expensive equipment.

DETAILED DESCRIPTION

Hereinafter, the scope of the present application will be described in more detail by way of examples, but the scope of the present application is not limited by the following examples.

1. Steel Wool Test

The steel wool resistance was evaluated by rubbing the following formed silica layer with a steel wool while keeping it at a temperature of 25° C. and 50% relative humidity. In the evaluation process, the evaluation was progressed while gradually increasing the load until defects such as scratches were visually observed, and the load was described as the evaluation result. Here, as the steel wool, a steel wool of grade #0000 sold by Briwax of Europe was used.

2. Evaluation of Reflectance

After laminating the formed silica layer on a PET (poly(ethylene terephthalate) film, the reflectance was evaluated based on light having a wavelength of 550 nm using a measuring instrument (spectrophotometer, Konica-Minolta, CM-2600D) at a temperature of 25° C. and 50% relative humidity.

Example 1

TEOS (tetraethoxy silane) was mixed with ethanol (EtOH) as a solvent and stirred for 10 minutes or so. Subsequently, the catalyst solution in which distilled water ($H_2O$) and hydrochloric acid (HCl) were mixed was slowly dropped to the mixture over approximately 5 minutes and stirred. After dropping, the mixture was further stirred for approximately 18 hours without separate cooling or constant temperature maintenance. After stirring, the pH was at a level of approximately 2 to 5. Here, the ratio of the mixed components was approximately 36.14:92.14:104.17:3.65 (weight ratio: distilled water:TEOS:ethanol:hydrochloric acid) or so.

When the content of silica solids in the mixture is calculated assuming that the entire added TEOS is 100% reacted, it can be calculated to be about 11.25 wt % or so. The obtained mixture was mixed with CTAB (cetyl triammonium bromide, C16; Aldrich) as a surfactant at a ratio of 50 parts by weight relative to 100 parts by weight of the calculated solid content to obtain a precursor composition.

Thereafter, the precursor composition was applied on a glass base material to a thickness of approximately 1 μm or so by a bar coating method and dried in an oven at 80° C. or so for 1 minute or so to form a precursor layer.

The obtained precursor layer was immersed in trioctylamine (TOA) at about 80° C. for 5 minutes or so to form a silica layer having a thickness of about 120 nm. The formed silica layer was washed with running water at about 40° C. or so for 3 minutes or so and dried in an oven at 80° C. for 2 minutes or so, and then the reflectance (Reflectance 1 in Table 1 below) was measured, and for removing the residual surfactant, it was washed using 50° C. ethanol for 1 hour, and then the reflectance was measured again (Reflectance 2 in Table 1 below). The physical property evaluation results of the formed silica layer were summarized in Table 1 below.

Examples 2 to 11

A silica layer was produced in the same manner as in Example 1, except that the kind and ratio of the surfactant were controlled as shown in Table 1 below, and the results were also summarized in Table 1 below.

TABLE 1

|  | Surfactant | Surfactant ratio | Reflectance 1 (%, 550 nm basis) | Reflectance 2 (%, 550 nm basis) | Steel wool test |
| --- | --- | --- | --- | --- | --- |
| Example 1 | CTAB | 50 | 3.67 | 2.52 | 140 g |
| Example 2 | CTAB | 75 | 3.57 | 2.31 | 100 g |
| Example 3 | CTAB | 100 | 4.14 | 1.8 | 80 g |
| Example 4 | DTAB | 50 | 2.11 | 2.17 | 100 g |
| Example 5 | DTAB | 100 | 2.31 | 2.43 | 100 g |
| Example 6 | F127 | 50 | — | 2.97 | 120 g |
| Example 7 | F127 | 100 | 3.95 | 2.94 | 120 g |
| Example 8 | Tween80 | 50 | 3.68 | 3.59 | — |
| Example 9 | Tween80 | 100 | 4.07 | 1.65 | 80 g |
| Example 10 | Brij98 | 50 | 3.77 | 1.79 | 100 g |
| Example 11 | Brij98 | 100 | 3.21 | 2.63 | 100 g |

Surfactant ratio parts by weight relative to 100 parts by weight of silica solid content
CTAB: cetyl triammonium bromide (manufactured by Aldrich)
DTAB: decyl triammonium bromide (manufactured by Aldrich)
F127: $PEO_{99}PPO_{69}PEO_{99}$, Mw = 12,500 (manufactured by BASF)
Tween 80 (manufactured by Aldrich Surfactant: Mw = 1310), manufactured by Aldrich
Brij 98 (manufactured by Aldrich Surfactant: Mw = 1150)
PEO: poly(ethylene oxide)
PPO: poly(propylene oxide)
Mw: weight average molecular weight Examples 12 to 20

A silica layer was produced in the same manner as in Example 1, except that the kind and ratio of the surfactant, the thickness of the silica layer and the cleaning conditions of the surfactant were controlled as shown in Table 1, and the results were summarized in Table 2 below.

TABLE 2

| | Surfactant | Surfactant ratio | Silica layer thickness (nm) | Surfactant cleaning conditions | Reflectance 2 (%, 550 nm basis) |
|---|---|---|---|---|---|
| Example 12 | F127 | 100 | 100 | water, 80° C., 16 hours | 3.66 |
| Example 13 | F127 | 100 | 140 | ethanol, 55° C., 16 hours | 0.95 |
| Example 14 | F127 | 100 | 120 | ethanol, 55° C., 16 hours | 1.07 |
| Example 15 | F127 | 100 | 100 | ethanol, 55° C., 16 hours | 1.52 |
| Example 16 | CTAB | 100 | 140 | ethanol, 55° C., 16 hours | 1.70 |
| Example 17 | Brij98 | 100 | 140 | ethanol, 55° C., 16 hours | 1.87 |
| Example 18 | F127 | 100 | 140 | acetone, 55° C., 16 hours | 1.36 |
| Example 19 | F127 | 100 | 120 | acetone, 55° C., 16 hours | 1.40 |
| Example 20 | F127 | 100 | 100 | acetone, 55° C., 16 hours | 1.95 |

Surfactant ratio: parts by weight relative to 100 parts by weight of silica solid content
CTAB: cetyl triammonium bromide (manufactured by Aldrich)
F127: $PEO_{99}PPO_{69}PEO_{99}$, Mw = 12,500 (manufactured by BASF)
Brij 98 (manufactured by Aldrich Surfactant: Mw = 1150)
PEO: poly(ethylene oxide)
PPO: poly(propylene oxide)
Mw: weight average molecular weight
Surfactant cleaning condition: applied solvent: holding temperature: cleaning time

The invention claimed is:

1. A method for preparing a silica layer, comprising:
preparing a precursor composition comprising a silica precursor, an acid catalyst and a surfactant;
forming a precursor layer by using the precursor composition; and
bringing to gelation the precursor layer,
wherein the gelation is performed by contacting the precursor layer with a liquid phase Lewis base, and
wherein the gelation is performed at a temperature of 100° C. or lower and performed for 1 to 20 minutes.

2. The method according to claim 1, wherein the silica precursor is a silane compound of the following formula D or E, a hydrolysate of the silane compound or a condensation reaction product of the silane compound:

$$SiR^1_{(4-n)}(OR^2)_n \quad \text{[Formula D]}$$

wherein:
$R^1$ is hydrogen, an alkyl group, an alkenyl group, an aryl group, an arylalkyl group, an epoxy group, or a (meth)acryloyloxyalkyl group;
$R^2$ is an alkyl group having 1 to 4 carbon atoms, an aryl group having 6 to 12 carbon atoms, or a hydrogen atom; and
n is 3 or 4,

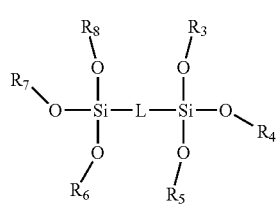
[Formula E]

wherein:
L is a divalent linking group selected from the group consisting of an alkylene group and an arylene group, or a combination of two or more thereof; and
$R_3$ to $R_8$ are each independently an alkyl group having 1 to 4 carbon atoms, an alkoxy group having 1 to 4 carbon atoms, an aryl group having 6 to 12 carbon atoms, or a hydrogen atom.

3. The method according to claim 1, wherein the precursor composition comprises a silica precursor in a ratio ranging from 5 to 60 wt %.

4. The method according to claim 1, wherein the precursor composition further comprises a solvent.

5. The method according to claim 4, wherein the solvent is a mixed solvent of an aqueous solvent and an organic solvent.

6. The method according to claim 1, wherein the surfactant forms micelles in the precursor layer or the precursor composition.

7. The method according to claim 1, wherein the precursor composition further comprises a solvent and the concentration of the surfactant is adjusted to be in a range of 1 to 5 times the critical micelle concentration for the solvent.

8. The method according to claim 1, wherein the surfactant is a cationic surfactant, an anionic surfactant or a nonionic surfactant.

9. The method according to claim 1, wherein the gelation comprises contacting the precursor layer with an amine compound having a pKa of 8 or less.

10. The method according to claim 1, wherein the precursor composition further comprises a latent base generator and the gelation comprises generating a base from the latent base generator.

11. The method according to claim 10, wherein the latent base generator is a compound of the following formula 11 or is an ionic compound having a cationic compound of one of the following Formulas 13 to 15 or one which is contained in a compound of the following Formula 18 or derived therefrom:

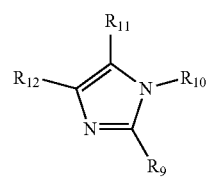
[Formula 11]

wherein $R_9$ is hydrogen, an alkyl group having 1 to 20 carbon atoms or an aryl group having 6 to 12 carbon atoms; $R_{11}$ and $R_{12}$ are each independently hydrogen or an alkyl group having 1 to 4 carbon atoms; and $R_{10}$ is hydrogen, an alkyl group having 1 to 4 carbon atoms, an arylalkyl group having 7 to 16 carbon atoms or a substituent of the following formula 12:

[Formula 12]

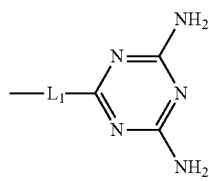

wherein $L_1$ is an alkylene group having 1 to 4 carbon atoms,

[Formula 13]

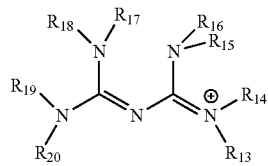

wherein $R_{13}$ to $R_{20}$ are each independently hydrogen or an alkyl group having 1 to 20 carbon atoms,

[Formula 14]

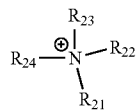

wherein $R_{21}$ to $R_{24}$ are each independently hydrogen or an alkyl group having 1 to 20 carbon atoms,

[Formula 15]

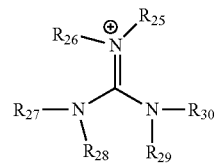

wherein $R_{25}$ to $R_{30}$ are each independently hydrogen or an alkyl group having 1 to 20 carbon atoms,

[Formula 18]

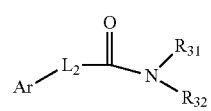

wherein $R_{31}$ and $R_{32}$ are each independently hydrogen, a linear or branched alkyl group having 1 to 4 carbon atoms or a cyclic alkyl group having 4 to 8 carbon atoms, or $R_{31}$ and $R_{32}$ are linked to each other to form a nitrogen-containing heterocyclic structure together with the nitrogen atom to which $R_{31}$ and $R_{32}$ are linked; Ar is an aryl group; and $L_2$ is -$L_3$-O— or an alkenyl group having 2 to 4 carbon atoms, wherein $L_3$ is an alkylene group having 1 to 4 carbon atoms or an alkylidene group having 1 to 4 carbon atoms.

12. The method according to claim 1, further comprising removing the surfactant after the gelation process.

13. The method according to claim 12, wherein removal of the surfactant is performed using an alcohol solvent, a ketone solvent or an acetate solvent.

14. The method according to claim 1, wherein the gelation of the precursor layer proceeds on a base material.

15. The method according to claim 14, wherein the base material is any one functional layer selected from the group consisting of a high-refraction layer, a hard coating layer, an antireflection layer, a polarizing film, a protective film of a polarizing film, a luminance enhancement film, a retardation film, a display panel and a touch panel.

* * * * *